(12) United States Patent
Davis et al.

(10) Patent No.: US 6,356,827 B1
(45) Date of Patent: Mar. 12, 2002

(54) AUXILIARY CONTROL WITH DIAGNOSTIC CAPABILITY

(75) Inventors: J. Roger Davis, RussiaVille; Wilbur Allen Robarge, Greentown, both of IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/579,481

(22) Filed: May 30, 2000

(51) Int. Cl.[7] .............................. B60H 1/00; H02J 1/10
(52) U.S. Cl. ........................ 701/36; 307/29; 180/53.1
(58) Field of Search ................... 701/36, 110; 237/5, 237/12.3 B, 12.3 C, 12.3 R; 180/53.1; 307/29, 38; 123/142.5 E, 142.5 R

(56) References Cited

U.S. PATENT DOCUMENTS

| | | | | |
|---|---|---|---|---|
| 4,348,726 A | * | 9/1982 | Igarashi et al. | 364/424 |
| 4,658,943 A | * | 4/1987 | Nishikawa et al. | 192/0.073 |
| 4,794,537 A | * | 12/1988 | Adasek et al. | 364/424.05 |
| 5,063,513 A | * | 11/1991 | Shank et al. | 364/424.05 |
| 5,543,776 A | * | 8/1996 | L'Esperance et al. | 340/426 |
| 6,115,657 A | * | 9/2000 | Petit | 701/36 |
| 6,128,104 A | * | 10/2000 | Okabe et al. | 358/442 |
| 6,184,591 B1 | * | 2/2001 | Viton | 307/29 |

* cited by examiner

Primary Examiner—Tan Nguyen
Assistant Examiner—Dalena Tran
(74) Attorney, Agent, or Firm—Jimmy L. Funke

(57) ABSTRACT

A control system automatically determines the presence of an auxiliary control. The system includes a controlled device and a main control. The controlled device includes a main control input and an auxiliary control input. If an auxiliary control is present, a discernible non-zero default signal is supplied on the auxiliary control input of the controlled device, when no inputs of the auxiliary control are asserted. This advantageously allows for the verification of correct assembly (i.e., determination of the presence or non-presence of an auxiliary control) without technician intervention.

19 Claims, 2 Drawing Sheets

US 6,356,827 B1

AUXILIARY CONTROL WITH DIAGNOSTIC CAPABILITY

TECHNICAL FIELD

The present invention is directed to an auxiliary control, and more specifically to an auxiliary control that provides for automated diagnostics.

BACKGROUND OF THE INVENTION

Today, many automobiles include auxiliary controls that are located for operator convenience. These controls are often mounted in the steering wheel or within reach of a rear seat passenger to allow for remote control of a controlled device (e.g., an automotive entertainment system (e.g., a radio receiver) or heating ventilation and air conditioning (HVAC) system). Many of these auxiliary controls are based on a simple resistive divider network that provides a unique voltage to a controller for each button (i.e., switch) that is asserted. When no button is asserted, a typical auxiliary control provides a signal of zero volts (i.e., ground) to the controlled device on an auxiliary control input. Unfortunately, when such an auxiliary control is installed, a diagnostic/verification tester cannot determine if the auxiliary control is connected without technician intervention. In a typical situation, a technician has to physically activate a button (i.e., a switch of the auxiliary control) in order for the tester to determine if the auxiliary control is present.

As such, a technique for automatically detecting the presence of an auxiliary control, without human intervention, is desirable to verify correct assembly.

SUMMARY OF THE INVENTION

The present invention is directed to a method and system that automatically determines the presence of an auxiliary control. A controlled device includes a main control input and an auxiliary control input. If an auxiliary control is present, a discernible non-zero default signal is provided on the auxiliary control input of the controlled device when no inputs of the auxiliary control are asserted. This advantageously allows for the verification of correct assembly (i.e., determination of the presence or non-presence of an auxiliary control) without technician intervention.

These and other features, advantages and objects of the present invention will be further understood and appreciated by those skilled in the art by reference to the following specification, claims and appended drawing's.

BRIEF DESCRIPTION OF THE DRAWINGS

The present invention will now be described, by way of example, with reference to the accompanying drawings, in which.

DESCRIPTION OF THE PREFERRED EMBODIMENT

To facilitate the verification of the presence of an auxiliary control without technician intervention, an auxiliary control is modified to present a non-zero default signal (i.e., a non-zero voltage) to a controlled device when no input of the auxiliary control is asserted. The auxiliary device can be, for example, an automotive entertainment system (e.g., a radio receiver) or a heating ventilation and air conditioning (HVAC) system. Utilizing the e approach described herein, the software of the controlled device is modified to indicate the presence of an auxiliary control if a non-zero default t signal is present at an auxiliary control input. This allows a diagnostic/verification tester, located at an assembly/manufacturing plant, to interrogate the controlled device through a serial vehicle bus to determine if the auxiliary control is present. The diagnostic/verification tester can then determine whether the automobile has been assembled in conformance with a vehicle manifest. In this manner, the diagnostic/verification tester can determine whether an auxiliary control is present without technician intervention.

Figure 1:
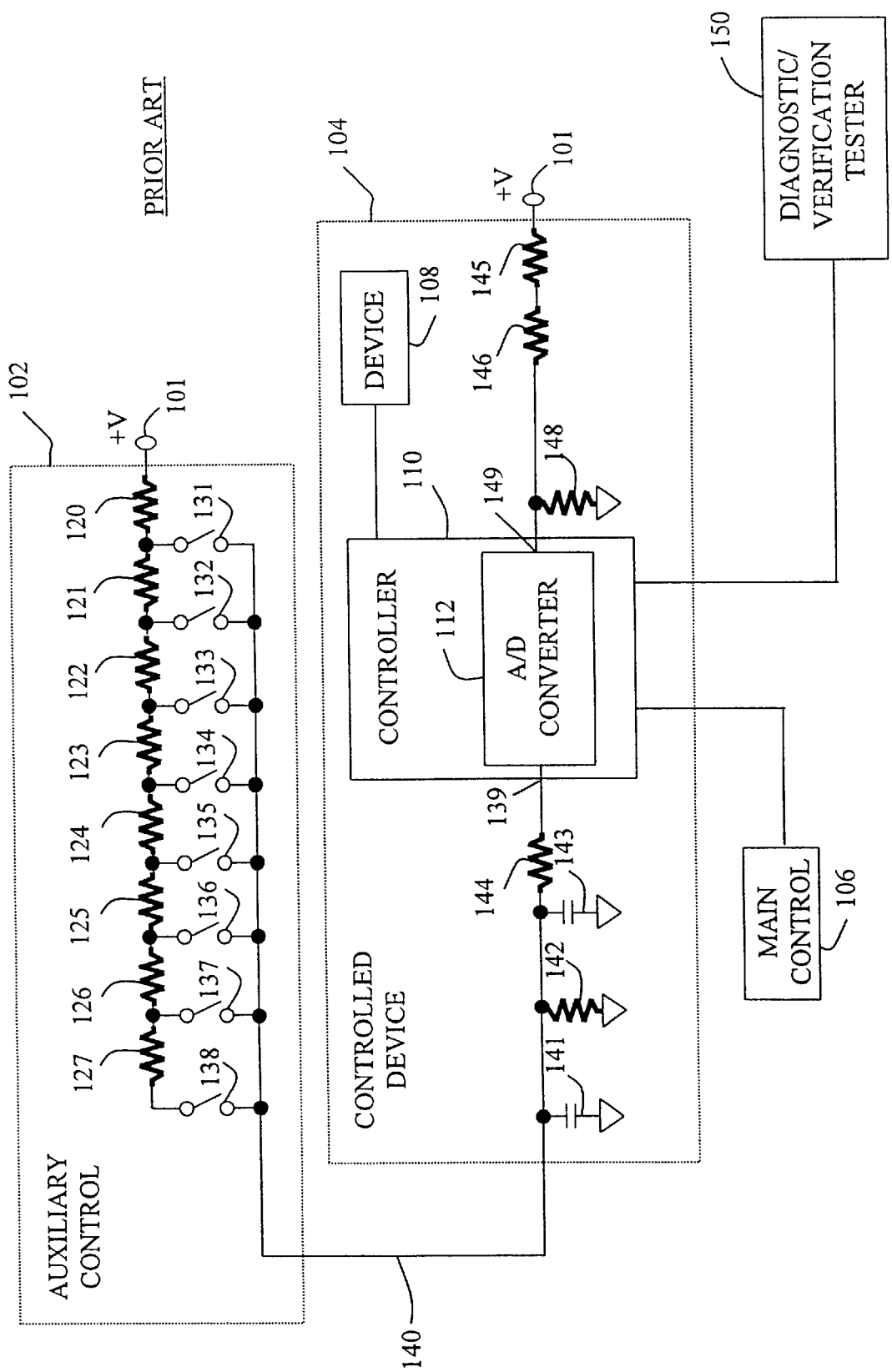
FIG. 1 is an electrical schematic and block diagram of a control system according to the prior art.

Referring to FIG. 1, a prior art auxiliary control 102 is shown coupled to a controlled device 104. Also coupled to the controlled device 104 is a main control 106. In a typical case, main control 106 is coupled to a input/output (I/O) pin of controller 110. Auxiliary control 102 includes a plurality of resistors 120, 121, 122, 123, 124, 125, 126 and 127, which are coupled in series and provide a resistive voltage divider. A first end of resistor 120 is coupled to a vehicle ignition switch (not shown) and is supplied with an ignition voltage (+V, through terminal 101) when the vehicle ignition switch is asserted. A second end of resistor 120 is coupled to a first terminal of switch 131 and a first end of resistor 121. A second end of resistor 121 is coupled to a first terminal of switch 132 and a first end of resistor 122. A second end of resistor 122 is coupled to a first terminal of switch 133 and a first end of resistor 123. A second end of resistor 123 is coupled to a first terminal of switch 134 and a first end of resistor 124. A second end of resistor 124 is coupled to a first end of resistor 125 and a first terminal of switch 135. A second end of resistor 125 is coupled to a first end of resistor 126 and a first terminal of switch 136. A second end of resistor 126 is coupled to a first end of resistor 127 and a first terminal of switch 137. A second end of resistor 127 is coupled to a first terminal of switch 138. A second terminal of switches 131, 132, 133, 134, 135, 136, 137 and 138 are connected (by signal line 140) to controlled device 104.

A capacitor 141 is coupled between signal line 140 and a ground common to auxiliary control 102 and controlled device 104. Capacitor 141 acts to suppress electromagnetic interference (EMI). Resistor 142 serves to pull signal line 140 to ground when switches 131–138 are all open. Capacitor 143 and resistor 144 act as a low pass filter and provide a signal on signal line 140 to an analog-to-digital (A/D) converter 112, internal to controller 110. Resistors 146 and 145 are serially coupled to the ignition voltage (+V) and provide a reference voltage to A/D converter 112. The ignition voltage is divided by resistors 145, 146 and 148. Resistor 148 is coupled between a voltage reference input 149, of controller 110, and the common ground.

In a typical automobile, controller 110 is coupled to a serial automotive bus. In this manner, a diagnostic/verification tester 150 can communicate with controller 10 so as to determine whether an auxiliary control 102 is present in an automobile under test. However, when diagnostic/verification tester 150 provides a command to controller 110 (to determine whether an auxiliary control 102 is present), if none of switches 131–138 are closed, controller 110 cannot determine whether the auxiliary control 102 is present. This is because resistor 142 pulls signal line 140 to ground, when none of switches 131–138 are asserted (i.e., closed). However, when the auxiliary control 102 is not present, resistor 142 also pulls signal line 140 to ground. As such, in order to determine whether an auxiliary control 102 is present during a verification process, a technician must assert at least one of switches 131–138, of auxiliary control 102, such that controller 110 can determine if a non-zero signal is present at input 139. With auxiliary controls of the prior art, the diagnostic/verification tester 150 cannot determine whether an auxiliary control 102 is present in a vehicle without technician intervention.

Figure 2:
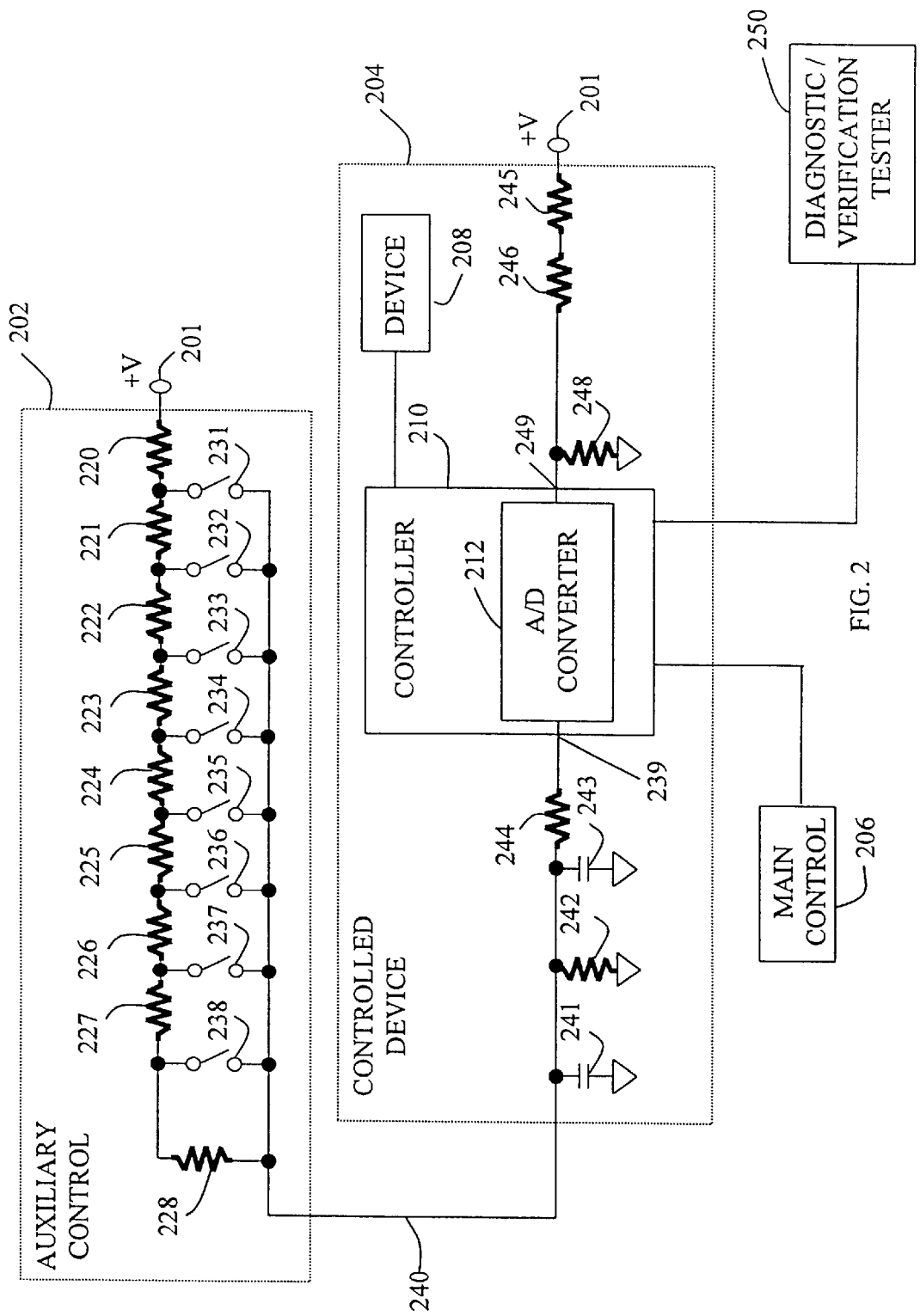
FIG. 2 is an electrical schematic and block diagram of a control system, according to an embodiment of the present invention.

FIG. 2 shows an auxiliary control 202 coupled to a controlled device 204, according to an embodiment of the present invention. Also coupled to the controlled device 204 is a main control 206. Auxiliary control 202 includes a plurality of resistors 220, 221, 222, 223, 224, 225, 226, 227 and 228. Resistors 220–228 are coupled in series and provide a resistive voltage divider. A first end of resistor 220 is coupled to a vehicle ignition switch (not shown) and is supplied with an ignition voltage (+V or Vign, at terminal 201) when the vehicle ignition switch is asserted. A second end of resistor 220 is coupled to a first terminal of switch 231 and a first end of resistor 221. A second end of resistor 221 is coupled to a first terminal of switch 232 and a first end of resistor 222. A second end of resistor 222 is coupled to a first terminal of switch 233 and a first end of resistor 223. A second end of resistor 223 is coupled to a first terminal of switch 234 and a first end of resistor 224. A second end of resistor 224 is coupled to a first end of resistor 225 and a first terminal of switch 235. A second end of resistor 225 is coupled to a first end of resistor 226 and a first terminal of switch 236. A second end of resistor 226 is coupled to a first end of resistor 227 and a first terminal of switch 237. A second end of resistor 227 is coupled to a first terminal of switch 238 and a first end of resistor 228. A second end of resistor 228 is coupled to a second terminal of switches 231–238 and to the controlled device 204, by signal line 240.

Resistor 228 provides a discernible non-zero default signal on the auxiliary control input of controlled device 204 when the auxiliary control 202 is present and no inputs (i.e., switches 231–238) of auxiliary control 202 are asserted. Thus, when a diagnostic/verification tester 250 communicates with controller 210 over a serial vehicle bus, controller 210 can read a voltage (i.e., Vaux) at input 239 to deter-mine whether the auxiliary control 202 is present.

A capacitor 241 is coupled between signal line 240 and a ground common to auxiliary control 202 and controlled device 204. Capacitor 241 acts to suppress electromagnetic interference (EMI). Resistor 242 (R242) serves to pull signal line 240 to ground when auxiliary control 202 is not present. Capacitor 243 and resistor 244 act as a low pass filter and provide a signal on signal line 240 to an A/D converter 212, internal to controller 210. Resistors 246 and 245 are serially coupled to the ignition voltage (+V or Vign, through terminal 201) and provide a reference voltage (Vref) to A/D converter 212. The ignition voltage (Vign) is divided by resistors 245, 246 and 248 to provide the reference voltage (Vref). Resistor 248 is coupled between a voltage reference input 249, of controller 210, and ground. In a typical automobile, controller 210 is coupled to a serial automotive bus.

In this manner, a diagnostic/verification tester 250 can communicate with controller 210 so as to determine whether an auxiliary control 202 is present in an automobile under test. When the diagnostic/verification tester 250 provides an appropriate command to controller 210. Controller 210 determines whether an auxiliary control 202 is present by reading the voltage at input 239. If the voltage is approximately equal to a default voltage, the auxiliary control 202 is present. As such, a diagnostic/verification tester 250 can determine whether an auxiliary control 202 is present in a vehicle without technician intervention.

In the system, described above, resistor 228 provides a discernible non-zero default signal on the auxiliary control input of controlled device 204, when present (with no inputs of auxiliary control 202 asserted). Thus, when diagnostic/verification tester 250 communicates with controller 210 over the serial vehicle bus, controller 210 has a default voltage that it checks for to determine whether the auxiliary control 202 is present.

In a preferred embodiment, controller 210 is a model TMS370, microprocessor manufactured and made commercially available by Texas Instruments. Preferably, resistors 220–228, 242, 246 and 248 have a one-percent tolerance. Using resistors with a one-percent tolerance is desirable, as using less accurate components can yield values that are outside of the limits set forth in Table 1. In a preferred embodiment, resistor 220 is a 1300 Ω resistor, resistor 221 is a 280 Ω resistor, resistor 222 is a 357 Ω resistor, resistor 223 is a 475 Ω resistor, resistor 224 is a 665 Ω resistor, resistor 225 is a 1000 Ω resistor, resistor 226 is a 1650 Ω resistor, resistor 227 is a 3160 Ω resistor, resistor 228 is a 8660 Ω resistor and resistor 242 is a 475 Ω resistor. Preferably, resistor 244 is a 22 kΩ resistor and capacitor 243 is a 0.01 μF capacitor. In the preferred embodiment, resistor 245 is 1 kΩ resistor, resistor 246 is 10.5 kΩ resistor and resistor 248 is a 4.75 kΩ resistor.

Table 1, shown below, provides exemplary target codes for each switch of auxiliary control 202 (i.e., S231–S238) and exemplary upper and lower limits for each switch. The codes of Table 1 are shown for example only and are based on utilizing an 8-bit A/D converter and resistors with the values disclosed above. A/D converter 212 samples the auxiliary control input (Vaux) provided by auxiliary control 202 and the reference voltage (Vref). As shown below, the ratio of the auxiliary control input and the reference voltage (Vaux/Vref) is multiplied by 255 to determine what switch, if any, is asserted. This is determined by comparing the result to values in the look-up table, as shown in Table 1. If none of the switches are asserted, R228 provides a non-zero default voltage such that controller 210 can detect the presence of auxiliary control 202. One of ordinary skill in the art will readily appreciate that modifying component values or tolerances or utilizing a controller that includes an A/D converter with an accuracy different than that of the TMS370 may require variation from the values shown in Table 1.

TABLE 1

| Switches | All Open | 231 | 232 | 233 | 234 | 235 | 236 | 237 | 238 |
|---|---|---|---|---|---|---|---|---|---|
| Upper Limit | 24 | 240 | 208 | 177 | 148 | 120 | 94 | 69 | 46 |
| Target | 23 | 234 | 202 | 172 | 144 | 117 | 91 | 67 | 44 |
| Lower Limit | 22 | 227 | 196 | 167 | 139 | 113 | 88 | 65 | 43 |

Example
Basic Equations for Deriving a Target Value for Switch 231

Vref=Vign*4.75 k/(4.75 k+10.5 k+1.00 k)=0.292*Vign

Vaux=Vign*475/(475+1.30 k)=0.268*Vign: Value for Switch 231

(Vaux/Vref)*255=(0.268/0.292)*255=234: Target Value for Switch 231

In summary, controller 210, using an internal A/D converter 212, measures a signal (Vaux) on signal line 240. As previously discussed, if an auxiliary control is not present, resistor 242 pulls the signal line 240 to ground. However, if auxiliary control 202 is present, the addition of resistor 228 provides a discernible non-zero default signal on the auxiliary control input of the controlled device 204. This allows diagnostic/verification tester 250 to determine the presence of an auxiliary control 204 without requiring a technician to press a switch of auxiliary control 202.

Preferably, the software for controlled device 204 is written to accept a default value as an indicator of the presence of auxiliary control 202. In this manner, diagnostic/verification tester 250 can interrogate controlled device 204, through the vehicle data bus, and determine if auxiliary control 202 is present. Tester 250 can then compare the result with the vehicle manifest to determine if the vehicle conforms to the manifest. Product software does not need to include the codes for determining whether all switches are open as these values can be incorporated within the software of tester 250. As such, adding the above described detection capability does not increase product memory requirements.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the Doctrine of Equivalents.

What is claimed is:

1. A method of automatically determining the presence of an auxiliary control, comprising the steps of:
   providing a controlled device, the controlled device including a main control input and an auxiliary control input; and
   determining whether an auxiliary control is present by examining a signal at the auxiliary control input, wherein the auxiliary control provides a discernable non-zero default signal on the auxiliary control input of the controlled device when the auxiliary control is present and no inputs of the auxiliary control are asserted.

2. The method of claim 1, wherein the step of determining whether the auxiliary control is present by examining a signal at the auxiliary control input, further includes the step of:
   interrogating the controlled device to determine whether the non-zero default signal is present on the auxiliary control input of the controlled device.

3. The method of claim 2, wherein the controlled device is coupled to an assembly plant verification tester, the tester causing the controlled device to determine whether the default signal is present on the auxiliary control input of the controlled device.

4. The method of claim 3, wherein the controlled device is coupled to the assembly plant verification tester by a serial vehicle bus.

5. The method of claim 1, wherein the controlled device is an automotive entertainment system.

6. The method of claim 5, wherein the automotive entertainment system is a radio receiver.

7. The method of claim 1, wherein the controlled device is an automotive heating, ventilation and air conditioning (HVAC) system.

8. A control system that automatically provides for the determination of the presence of an auxiliary control, comprising:
   a controlled device, the controlled device including a main control input and an auxiliary control input; and
   a main control coupled to the controlled device through the main control input, wherein if an auxiliary control is coupled to the auxiliary control input of the controlled device it provides a discernable non-zero default signal on the auxiliary control input of the controlled device when no inputs of the auxiliary control are asserted such that the controlled device can determine its presence.

9. The system of claim 8, wherein the controlled device is coupled to an assembly plant verification tester, the tester causing the controlled device to determine whether the default signal is present on the auxiliary control input of the controlled device.

10. The system of claim 9, wherein the controlled device is coupled to the assembly plant verification tester by a serial vehicle bus.

11. The system of claim 8, wherein the controlled device is an automotive entertainment system.

12. The system of claim 11, wherein the automotive entertainment system is a radio receiver.

13. The system of claim 8, wherein the controlled device is an automotive heating, ventilation and air conditioning (HVAC) system.

14. An automotive control system that provides for the automatic determination of the presence of an auxiliary control, comprising:
   a controlled device, the controlled device including a main control input and an auxiliary control input, the controlled device performing a function within an automobile; and
   a main control coupled to the controlled device through the main control input, wherein if an auxiliary control is coupled to the auxiliary control input of the controlled device it provides a discernable non-zero default signal on the auxiliary control input of the controlled device when no inputs of the auxiliary control are asserted such that the controlled device can determine its presence.

15. The system of claim 14, wherein the controlled device is coupled to an automobile assembly plant verification tester, the tester causing the controlled device to determine whether the default signal is present on the auxiliary control input of the controlled device.

16. The system of claim 15, wherein the controlled device is coupled to the automobile assembly plant verification tester by a serial vehicle bus.

17. The system of claim 14, wherein the controlled device is an automotive entertainment system.

18. The system of claim 17, wherein the automotive entertainment system is a radio receiver.

19. The system of claim 14, wherein the controlled device is an automotive heating, ventilation and air conditioning (HVAC) system.

* * * * *